United States Patent
Park et al.

(10) Patent No.: US 10,284,229 B2
(45) Date of Patent: *May 7, 2019

(54) BIT INTERLEAVER FOR LOW-DENSITY PARITY CHECK CODEWORD HAVING LENGTH OF 64800 AND CODE RATE OF 3/15 AND 64-SYMBOL MAPPING, AND BIT INTERLEAVING METHOD USING SAME

(71) Applicant: ELECTRONICS AND TELECOMMUNICATIONS RESEARCH INSTITUTE, Daejeon (KR)

(72) Inventors: Sung-Ik Park, Daejeon (KR); Sun-Hyoung Kwon, Daejeon (KR); Jae-Young Lee, Daejeon (KR); Heung-Mook Kim, Daejeon (KR); Nam-Ho Hur, Sejong (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/706,469

(22) Filed: Sep. 15, 2017

(65) Prior Publication Data

US 2018/0006665 A1     Jan. 4, 2018

Related U.S. Application Data

(63) Continuation of application No. 15/374,609, filed on Dec. 9, 2016, now Pat. No. 9,806,744, which is a
(Continued)

(30) Foreign Application Priority Data

Jan. 27, 2015    (KR) ........................ 10-2015-0012879

(51) Int. Cl.
| | | |
|---|---|---|
| *G06F 11/00* | (2006.01) | |
| *H03M 13/27* | (2006.01) | |
| *H03M 13/11* | (2006.01) | |
| *G06F 11/10* | (2006.01) | |

(Continued)

(52) U.S. Cl.
CPC ..... *H03M 13/2792* (2013.01); *G06F 11/1076* (2013.01); *H03M 13/1102* (2013.01);
(Continued)

(58) Field of Classification Search
None
See application file for complete search history.

(56) References Cited

U.S. PATENT DOCUMENTS

2004/0086059 A1*   5/2004   Eroz ................. H03M 13/11
                                                               375/298
2011/0075710 A1    3/2011   Park et al.
(Continued)

FOREIGN PATENT DOCUMENTS

| CA | 2973181 A1 | 7/2016 |
|---|---|---|
| EP | 2 525 495 A1 | 11/2012 |

*Primary Examiner* — Daniel F. McMahon

(57) ABSTRACT

A bit interleaver, a bit-interleaved coded modulation (BICM) device and a bit interleaving method are disclosed herein. The bit interleaver includes a first memory, a processor, and a second memory. The first memory stores a low-density parity check (LDPC) codeword having a length of 64800 and a code rate of 3/15. The processor generates an interleaved codeword by interleaving the LDPC codeword on a bit group basis. The size of the bit group corresponds to a parallel factor of the LDPC codeword. The second memory provides the interleaved codeword to a modulator for 64-symbol mapping.

4 Claims, 6 Drawing Sheets

Related U.S. Application Data continuation of application No. 14/625,563, filed on Feb. 18, 2015, now Pat. No. 9,553,606.

(51) Int. Cl.
*H03M 13/25* (2006.01)
*H03M 13/00* (2006.01)

(52) U.S. Cl.
CPC .... *H03M 13/1151* (2013.01); *H03M 13/1165* (2013.01); *H03M 13/255* (2013.01); *H03M 13/2739* (2013.01); *H03M 13/2778* (2013.01); *H03M 13/6552* (2013.01)

(56) References Cited

U.S. PATENT DOCUMENTS

| | | | |
|---|---|---|---|
| 2011/0090948 A1 | 4/2011 | Zhou et al. | |
| 2011/0167317 A1 | 7/2011 | Kim et al. | |
| 2013/0254617 A1 | 9/2013 | Shinohara et al. | |
| 2015/0039973 A1* | 2/2015 | Jeong | H03M 13/11 714/776 |
| 2015/0095744 A1* | 4/2015 | Jeong | H03M 13/2792 714/776 |
| 2015/0236721 A1* | 8/2015 | Kim | H04L 1/0041 714/776 |
| 2015/0256376 A1* | 9/2015 | Limberg | H04L 27/2646 375/261 |
| 2015/0358648 A1* | 12/2015 | Limberg | H04L 27/2627 725/109 |
| 2016/0049960 A1* | 2/2016 | Shinohara | H03M 13/6555 714/776 |

* cited by examiner

BIT INTERLEAVER FOR LOW-DENSITY PARITY CHECK CODEWORD HAVING LENGTH OF 64800 AND CODE RATE OF 3/15 AND 64-SYMBOL MAPPING, AND BIT INTERLEAVING METHOD USING SAME

CROSS-REFERENCE TO RELATED APPLICATIONS

This application is a continuation of U.S. application Ser. No. 15/374,609, filed Dec. 9, 2016, which is a continuation of and claims priority to U.S. application Ser. No. 14/625,563 filed Feb. 18, 2015, now issued as U.S. Pat. No. 9,553,606, issued on Jan. 24, 2017, which claims the benefit of Korean Patent Application No. 10-2015-0012879, filed Jan. 27, 2015, which is hereby incorporated by reference herein in its entirety.

BACKGROUND

1. Technical Field

The present disclosure relates generally to an interleaver and, more particularly, to a bit interleaver that is capable of distributing burst errors occurring in a digital broadcast channel.

2. Description of the Related Art

Bit-Interleaved Coded Modulation (BICM) is bandwidth-efficient transmission technology, and is implemented in such a manner that an error-correction coder, a bit-by-bit interleaver and a high-order modulator are combined with one another.

BICM can provide excellent performance using a simple structure because it uses a low-density parity check (LDPC) coder or a Turbo coder as the error-correction coder. Furthermore, BICM can provide high-level flexibility because it can select modulation order and the length and code rate of an error correction code in various forms. Due to these advantages, BICM has been used in broadcasting standards, such as DVB-T2 and DVB-NGH, and has a strong possibility of being used in other next-generation broadcasting systems.

However, in spite of those advantages, BICM suffers from the rapid degradation of performance unless burst errors occurring in a channel are appropriately distributed via the bit-by-bit interleaver. Accordingly, the bit-by-bit interleaver used in BICM should be designed to be optimized for the modulation order or the length and code rate of the error correction code.

SUMMARY

At least one embodiment of the present invention is directed to the provision of an intra-BICM bit interleaver that can effectively distribute burst errors occurring in a broadcasting system channel.

At least one embodiment of the present invention is directed to the provision of a bit interleaver that is optimized for an LDPC coder having a length of 64800 and a code rate of 3/15 and a modulator performing 64-symbol mapping and, thus, can be applied to next-generation broadcasting systems, such as ATSC 3.0.

In accordance with an aspect of the present invention, there is provided a bit interleaver, including a first memory configured to store a low-density parity check (LDPC) codeword having a length of 64800 and a code rate of 3/15; a processor configured to generate an interleaved codeword by interleaving the LDPC codeword on a bit group basis, the size of the bit group corresponding to a parallel factor of the LDPC codeword; and a second memory configured to provide the interleaved codeword to a modulator for 64-symbol mapping.

The 64-symbol mapping may be NUC (Non-Uniform Constellation) symbol mapping corresponding to 64 constellations (symbols).

The parallel factor may be 360, and each of the bit groups may include 360 bits.

The LDPC codeword may be represented by ($u_0$, $u_1$, ..., $u_{N_{ldpc}-1}$) (where $N_{ldpc}$ is 64800), and may be divided into 180 bit groups each including 360 bits, as in the following equation:

$$X_j = \{u_k | 360 \times j \leq k < 360 \times (j+1), 0 \leq k < N_{ldpc}\} \text{ for } 0 \leq j < N_{group}$$

where $X_j$ is an j-th bit group, $N_{ldpc}$ is 64800, and $N_{group}$ is 180.

The interleaving may be performed using the following equation using permutation order:

$$Y_j = X_{\pi(j)}, 0 \leq j \leq N_{group}$$

where $X_j$ is the j-th bit group, $Y_j$ is an interleaved j-th bit group, and $\pi(j)$ is a permutation order for bit group-based interleaving (bit group-unit interleaving).

The permutation order may correspond to an interleaving sequence represented by the following equation:

interleaving sequence={74 72 104 62 122 35 130 0
95 150 139 151 133 109 31 59 18 148 9 105
57 132 102 100 115 101 7 21 141 30 8 1 93 92
163 108 52 159 24 89 117 88 178 113 98 179
144 156 54 164 12 63 39 22 25 137 13 41 44
80 87 111 145 23 85 166 83 55 154 20 84 58
26 126 170 103 11 33 172 155 116 169 142 70
161 47 3 162 77 19 28 97 124 6 168 107 60 76
143 121 42 157 65 43 173 56 171 90 131 119
94 5 68 138 149 73 67 53 61 4 86 99 75 36 15
48 177 167 174 51 176 81 120 158 123 34 49
128 10 134 147 96 160 50 146 16 38 78 91
152 46 127 27 175 135 79 125 82 2 129 153
14 40 32 114 106 17 110 140 71 136 112 45
64 29 69 118 66 37 165}

In accordance with another aspect of the present invention, there is provided a bit interleaving method, including storing an LDPC codeword having a length of 64800 and a code rate of 3/15; generating an interleaved codeword by interleaving the LDPC codeword on a bit group basis corresponding to the parallel factor of the LDPC codeword; and outputting the interleaved codeword to a modulator for 64-symbol mapping.

In accordance with still another aspect of the present invention, there is provided a BICM device, including an error-correction coder configured to output an LDPC codeword having a length of 64800 and a code rate of 3/15; a bit interleaver configured to interleave the LDPC codeword on a bit group basis corresponding to the parallel factor of the LDPC codeword and output the interleaved codeword; and a modulator configured to perform 64-symbol mapping on the interleaved codeword.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION

Figure 1:
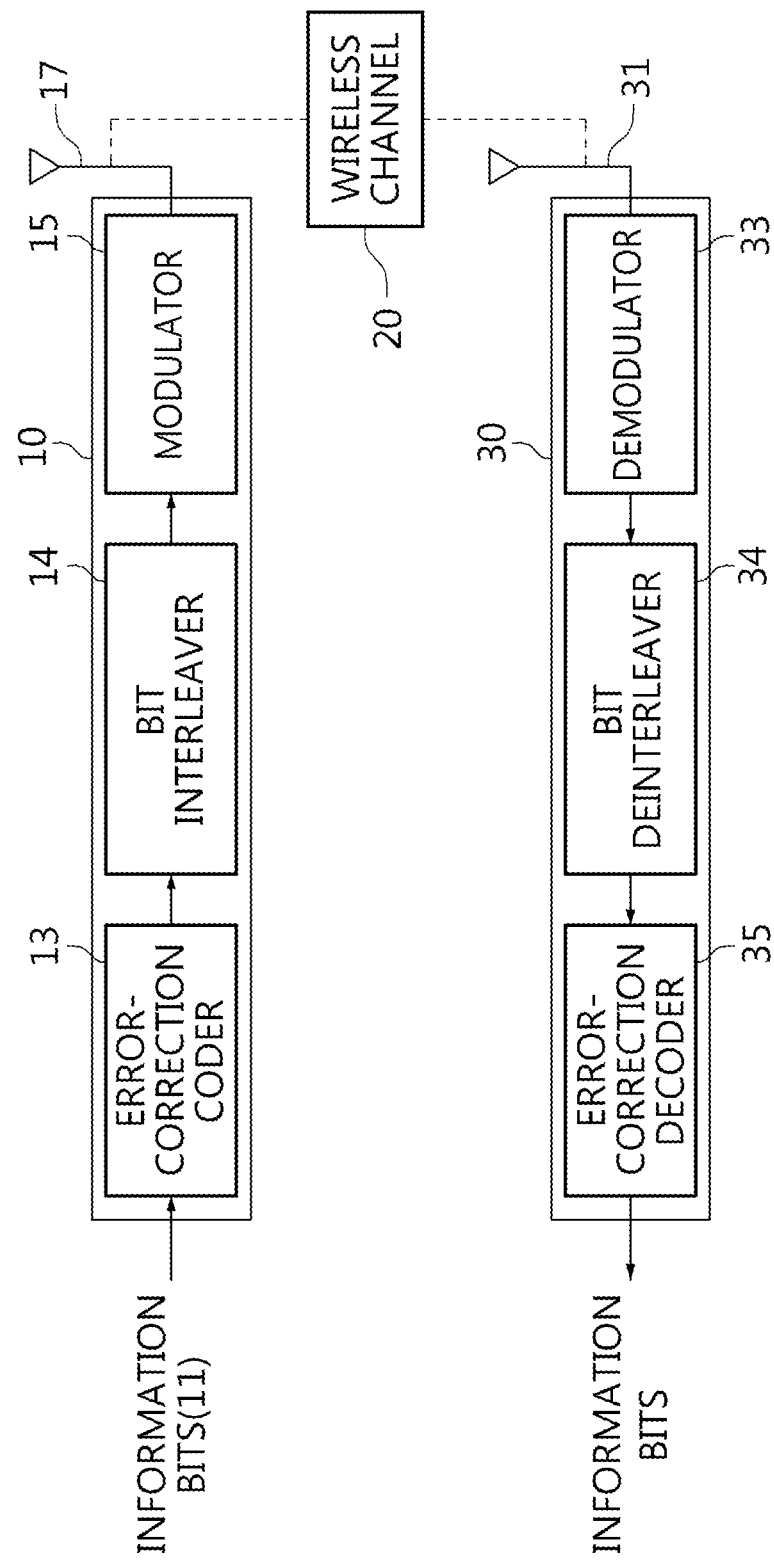
FIG. 1 is a block diagram illustrating a broadcast signal transmission and reception system according to an embodiment of the present invention.

Embodiments of the present invention will be described in detail below with reference to the accompanying drawings. Repeated descriptions and descriptions of well-known functions and configurations that have been deemed to make the gist of the present invention unnecessarily obscure will be omitted below. The embodiments of the present invention are intended to fully describe the present invention to persons having ordinary knowledge in the art to which the present invention pertains. Accordingly, the shapes, sizes, etc. of components in the drawings may be exaggerated to make the description obvious.

Embodiments of the present invention will be described in detail below with reference to the accompanying drawings.

FIG. 1 is a block diagram illustrating a broadcast signal transmission and reception system according to an embodiment of the present invention.

Referring to FIG. 1, it can be seen that a BICM device 10 and a BICM reception device 30 communicate with each other over a wireless channel 20.

The BICM device 10 generates an n-bit codeword by encoding k information bits 11 using an error-correction coder 13. In this case, the error-correction coder 13 may be an LDPC coder or a Turbo coder.

The codeword is interleaved by a bit interleaver 14, and thus the interleaved codeword is generated.

In this case, the interleaving may be performed on a bit group basis (by a unit of a bit group). In this case, the error-correction coder 13 may be an LDPC coder having a length of 64800 and a code rate of 3/15. A codeword having a length of 64800 may be divided into a total of 180 bit groups. Each of the bit groups may include 360 bits, i.e., the parallel factor of an LDPC codeword.

In this case, the interleaving may be performed on a bit group basis (by a unit of a bit group) in accordance with an interleaving sequence, which will be described later.

In this case, the bit interleaver 14 prevents the performance of error correction code from being degraded by effectively distributing burst errors occurring in a channel. In this case, the bit interleaver 14 may be separately designed in accordance with the length and code rate of the error correction code and the modulation order.

The interleaved codeword is modulated by a modulator 15, and is then transmitted via an antenna 17.

In this case, the modulator 15 may be based on a concept including symbol mapper (symbol mapping device). In this case, the modulator 15 may be a symbol mapping device performing 64-symbol mapping which maps codes onto 64 constellations (symbols).

In this case, the modulator 15 may be a uniform modulator, such as a quadrature amplitude modulation (QAM) modulator, or a non-uniform modulator.

The modulator 15 may be a symbol mapping device performing NUC (Non-Uniform Constellation) symbol mapping which uses 64 constellations (symbols).

The signal transmitted via the wireless channel 20 is received via the antenna 31 of the BICM reception device 30, and, in the BICM reception device 30, is subjected to a process reverse to the process in the BICM device 10. That is, the received data is demodulated by a demodulator 33, is deinterleaved by a bit deinterleaver 34, and is then decoded by an error correction decoder 35, thereby finally restoring the information bits.

It will be apparent to those skilled in the art that the above-described transmission and reception processes have been described within a minimum range required for a description of the features of the present invention and various processes required for data transmission may be added.

Figure 2:
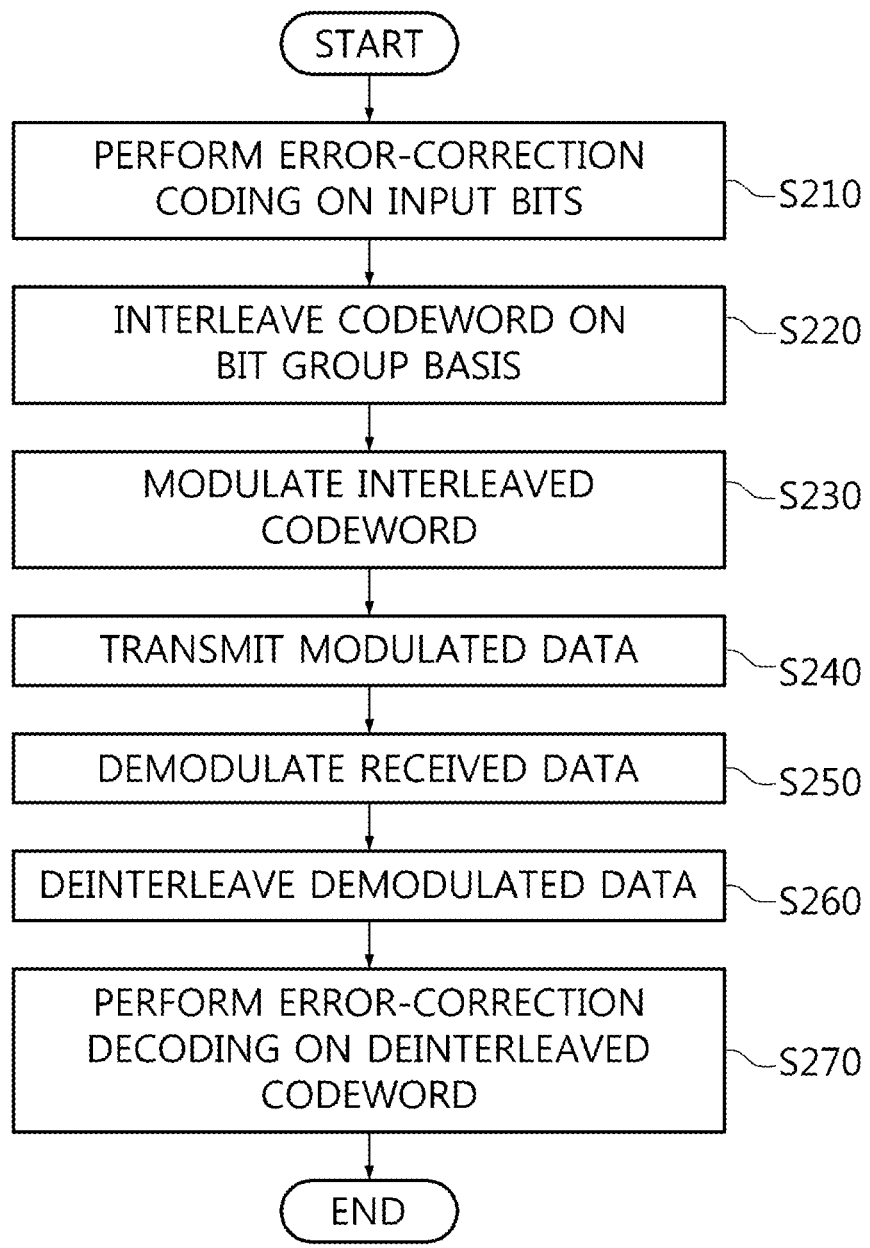
FIG. 2 is an operation flowchart illustrating a broadcast signal transmission and reception method according to an embodiment of the present invention.

FIG. 2 is an operation flowchart illustrating a broadcast signal transmission and reception method according to an embodiment of the present invention.

Referring to FIG. 2, in the broadcast signal transmission and reception method according to this embodiment of the present invention, input bits (information bits) are subjected to error-correction coding at step S210.

That is, at step S210, an n-bit codeword is generated by encoding k information bits using the error-correction coder.

In this case, step S210 may be performed as in an LDPC encoding method, which will be described later.

Furthermore, in the broadcast signal transmission and reception method, an interleaved codeword is generated by interleaving the n-bit codeword on a bit group basis at step S220.

In this case, the n-bit codeword may be an LDPC codeword having a length of 64800 and a code rate of 3/15. The codeword having a length of 64800 may be divided into a total of 180 bit groups. Each of the bit groups may include 360 bits corresponding to the parallel factors of an LDPC codeword.

In this case, the interleaving may be performed on a bit group basis (by a unit of a bit group) in accordance with an interleaving sequence, which will be described later.

Furthermore, in the broadcast signal transmission and reception method, the encoded data is modulated at step S230.

That is, at step S230, the interleaved codeword is modulated using the modulator.

In this case, the modulator may be based on a concept including symbol mapper (symbol mapping device). In this case, the modulator may be a symbol mapping device performing 64-symbol mapping which maps codes onto 64 constellations (symbols).

In this case, the modulator may be a uniform modulator, such as a QAM modulator, or a non-uniform modulator.

The modulator may be a symbol mapping device performing NUC (Non-Uniform Constellation) symbol mapping which uses 64 constellations (symbols).

Furthermore, in the broadcast signal transmission and reception method, the modulated data is transmitted at step S240.

That is, at step S240, the modulated codeword is transmitted over the wireless channel via the antenna.

Furthermore, in the broadcast signal transmission and reception method, the received data is demodulated at step S250.

That is, at step S250, the signal transmitted over the wireless channel is received via the antenna of the receiver, and the received data is demodulated using the demodulator.

Furthermore, in the broadcast signal transmission and reception method, the demodulated data is deinterleaved at step S260. In this case, the deinterleaving of step S260 may be reverse to the operation of step S220.

Furthermore, in the broadcast signal transmission and reception method, the deinterleaved codeword is subjected to error correction decoding at step S270.

That is, at step S270, the information bits are finally restored by performing error correction decoding using the error correction decoder of the receiver.

In this case, step S270 corresponds to a process reverse to that of an LDPC encoding method, which will be described later.

An LDPC code is known as a code very close to the Shannon limit for an additive white Gaussian noise (AWGN) channel, and has the advantages of asymptotically excellent performance and parallelizable decoding compared to a turbo code.

Generally, an LDPC code is defined by a low-density parity check matrix (PCM) that is randomly generated. However, a randomly generated LDPC code requires a large amount of memory to store a PCM, and requires a lot of time to access memory. In order to overcome these problems, a quasi-cyclic LDPC (QC-LDPC) code has been proposed. A QC-LDPC code that is composed of a zero matrix or a circulant permutation matrix (CPM) is defined by a PCM that is expressed by the following Equation 1:

$$H = \begin{bmatrix} J^{a_{11}} & J^{a_{12}} & \cdots & J^{a_{1n}} \\ J^{a_{21}} & J^{a_{22}} & \cdots & J^{a_{2n}} \\ \vdots & \vdots & \ddots & \vdots \\ J^{a_{m1}} & J^{a_{m2}} & \cdots & J^{a_{mn}} \end{bmatrix}, \text{ for } a_{ij} \in \{0, 1, \ldots, L-1, \infty\} \quad (1)$$

In this equation, J is a CPM having a size of L×L, and is given as the following Equation 2. In the following description, L may be 360.

$$J_{L \times L} = \begin{bmatrix} 0 & 1 & 0 & \cdots & 0 \\ 0 & 0 & 1 & \cdots & 0 \\ \vdots & \vdots & \vdots & \ddots & \vdots \\ 0 & 0 & 0 & \cdots & 1 \\ 1 & 0 & 0 & \cdots & 0 \end{bmatrix} \quad (2)$$

Furthermore, $J^i$ is obtained by shifting an L×L identity matrix I ($J^0$) to the right i (0≤i<L) times, and $J^\infty$ is an L×L zero matrix. Accordingly, in the case of a QC-LDPC code, it is sufficient if only index exponent i is stored in order to store $J^i$, and thus the amount of memory required to store a PCM is considerably reduced.

Figure 3:
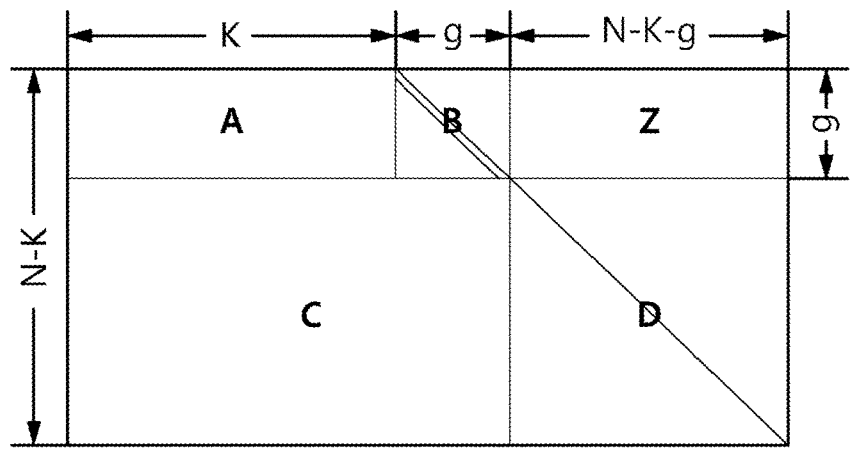
FIG. 3 is a diagram illustrating the structure of a parity check matrix (PCM) corresponding to an LDPC code to according to an embodiment of the present invention.

FIG. 3 is a diagram illustrating the structure of a PCM corresponding to an LDPC code to according to an embodiment of the present invention.

Referring to FIG. 3, the sizes of matrices A and C are g×K and (N−K−g)×(K+g), respectively, and are composed of an L×L zero matrix and a CPM, respectively. Furthermore, matrix Z is a zero matrix having a size of g×(N−K−g), matrix D is an identity matrix having a size of (N−K−g)×(N−K−g), and matrix B is a dual diagonal matrix having a size of g×g. In this case, the matrix B may be a matrix in which all elements except elements along a diagonal line and neighboring elements below the diagonal line are 0, and may be defined as the following Equation 3:

$$B_{g \times g} = \begin{bmatrix} I_{L \times L} & 0 & 0 & \cdots & 0 & 0 & 0 \\ I_{L \times L} & I_{L \times L} & 0 & \cdots & 0 & 0 & 0 \\ 0 & I_{L \times L} & I_{L \times L} & \vdots & 0 & 0 & 0 \\ \vdots & \vdots & \vdots & \ddots & \vdots & \vdots & \vdots \\ 0 & 0 & 0 & \cdots & I_{L \times L} & I_{L \times L} & 0 \\ 0 & 0 & 0 & \cdots & 0 & I_{L \times L} & I_{L \times L} \end{bmatrix} \quad (3)$$

where $I_{L \times L}$ is an identity matrix having a size of L×L.

That is, the matrix B may be a bit-wise dual diagonal matrix, or may be a block-wise dual diagonal matrix having identity matrices as its blocks, as indicated by Equation 3. The bit-wise dual diagonal matrix is disclosed in detail in Korean Patent Application Publication No. 2007-0058438, etc.

In particular, it will be apparent to those skilled in the art that when the matrix B is a bit-wise dual diagonal matrix, it is possible to perform conversion into a Quasi-cyclic form by applying row or column permutation to a PCM including the matrix B and having a structure illustrated in FIG. 3.

In this case, N is the length of a codeword, and K is the length of information.

The present invention proposes a newly designed QC-LDPC code in which the code rate thereof is 3/15 and the length of a codeword is 64800, as illustrated in the following Table 1. That is, the present invention proposes an LDPC code that is designed to receive information having a length of 12960 and generate an LDPC codeword having a length of 64800.

Table 1 illustrates the sizes of the matrices A, B, C, D and Z of the QC-LDPC code according to the present invention:

TABLE 1

| | | Sizes | | | | |
|---|---|---|---|---|---|---|
| Code rate | Length | A | B | C | D | Z |
| 3/15 | 64800 | 1800 × 12960 | 1800 × 1800 | 50040 × 14760 | 50040 × 50040 | 1800 × 50040 |

The newly designed LDPC code may be represented in the form of a sequence (progression), an equivalent relationship is established between the sequence and matrix (parity bit check matrix), and the sequence may be represented, as follows:

| | Sequence Table |
|---|---|
| 1st row: | 920 963 1307 2648 6529 17455 18883 19848 19909 24149 24249 38395 41589 48032 50313 |
| 2nd row: | 297 736 744 5951 8438 9881 15522 16462 23036 25071 34915 41193 42975 43412 49612 |
| 3rd row: | 10 223 879 4662 6400 8691 14561 16626 17408 22810 31795 32580 43639 45223 47511 |
| 4th row: | 629 842 1666 3150 7596 9465 12327 18649 19052 19279 29743 30197 40106 48371 51155 |
| 5th row: | 857 953 1116 8725 8726 10508 17112 21007 30649 32113 36962 39254 46636 49599 50099 |
| 6th row: | 700 894 1128 5527 6216 15123 21510 24584 29026 31416 37158 38460 42511 46932 51832 |
| 7th row: | 430 592 1521 3018 10430 18090 18092 18388 20017 34383 35006 38255 41700 42158 45211 |
| 8th row: | 91 1485 1733 11624 12969 17531 21324 23657 27148 27509 28753 35093 43352 48104 51648 |
| 9th row: | 18 34 117 6739 8679 11018 12163 16733 24113 25906 30605 32700 36465 40799 43359 |
| 10th row: | 481 1545 1644 4216 4606 6015 6609 14659 16966 18056 19137 26670 28001 30668 49061 |
| 11st row: | 174 1208 1387 10580 11507 13751 16344 22735 23559 26492 27672 33399 44787 44842 45992 |
| 12nd row: | 1151 1185 1472 6727 10701 14755 15688 17441 21281 23692 23994 31366 35854 37301 43148 |
| 13rd row: | 200 799 1583 3451 5880 7604 8194 13428 16109 18584 20463 22373 31977 47073 50087 |
| 14th row: | 346 843 1352 13409 17376 18233 19119 19382 20578 24183 32052 32912 43204 48539 49893 |
| 15th row: | 76 457 1169 13516 14520 14638 22391 25294 31067 31325 36711 44072 44854 49274 51624 |
| 16th row: | 759 798 1420 6661 12101 12573 13796 15510 18384 26649 30875 36856 38994 43634 49281 |
| 17th row: | 551 797 1000 3999 10040 11246 15793 23298 23822 38480 39209 45334 46603 46625 47633 |
| 18th row: | 441 875 1554 5336 25948 28842 30329 31503 39203 39673 46250 47021 48555 49229 51421 |
| 19th row: | 963 1470 1642 3180 3943 6513 9125 15641 17083 18876 28499 32764 42420 43922 45762 |
| 20th row: | 293 324 867 8803 10582 17926 19830 22497 24848 30034 34659 37721 41523 42534 47806 |
| 21st row: | 687 975 1356 2721 3002 3874 4119 12336 17119 21251 22482 22833 24681 26225 48514 |
| 22nd row: | 549 951 1268 9144 11710 12623 18949 19362 22769 22603 34559 34683 36338 47140 51069 |
| 23rd row: | 52 890 1669 3905 5670 14712 18314 22297 30328 33389 35447 35512 35516 40587 41918 |
| 24th row: | 656 1063 1694 3338 3793 4513 6009 7441 13393 20920 26501 27576 29623 31261 42093 |
| 25th row: | 425 1018 1086 9226 10024 17552 24714 24877 25853 28918 30945 31205 33103 42564 47214 |
| 26th row: | 32 1145 1438 4916 4945 14830 17505 19919 24118 28506 30173 31754 34230 48608 50291 |
| 27th row: | 559 1216 1272 2856 8703 9371 9708 16180 19127 24337 26390 36649 41105 42988 44096 |
| 28th row: | 362 658 1191 7769 8998 14068 15921 18471 18780 31995 32798 32864 37293 39468 44308 |
| 29th row: | 1136 1389 1785 8800 12541 14723 15210 15859 26569 30127 31357 32898 38760 50523 51715 |
| 30th row: | 44 80 1368 2010 2228 6614 6767 9275 25237 30208 39537 42041 49906 50701 51199 |
| 31st row: | 1522 1536 1765 3914 5350 10869 12278 12886 16379 22743 23987 26306 30966 33854 41356 |
| 32nd row: | 212 648 709 3443 7007 7545 12484 13358 17008 20433 25862 31945 39207 39752 40313 |
| 33rd row: | 789 1062 1431 12280 17415 18098 23729 37278 38454 38763 41039 44600 50700 51139 51696 |
| 34th row: | 825 1298 1391 4882 12738 17569 19177 19896 27401 37041 39181 39199 41832 43636 45775 |
| 35th row: | 992 1053 1485 3806 16929 18596 22017 23435 23932 30211 30390 34469 37213 46220 49646 |
| 36th row: | 771 850 1039 5180 7653 13547 17980 23365 25318 34374 36115 38753 42993 49696 51031 |
| 37th row: | 7383 14780 15959 18921 22579 28612 32038 36727 40851 41947 42707 50480 |
| 38th row: | 8733 9464 13148 13899 19396 22933 23039 25047 29938 33588 33796 48930 |
| 39th row: | 2493 12555 16706 23905 35400 36330 37065 38866 40305 43807 43917 50621 |
| 40th row: | 6437 11927 14542 16617 17317 17755 18832 24772 29273 31136 36925 46663 |
| 41st row: | 2191 3431 6288 6430 9908 13069 23014 24822 29818 39914 46010 47246 |

An LDPC code that is represented in the form of a sequence is being widely used in the DVB standard.

According to an embodiment of the present invention, an LDPC code presented in the form of a sequence is encoded, as follows. It is assumed that there is an information block $S=(s_0, s_1, \ldots, s_{K-1})$ having an information size K. The LDPC encoder generates a codeword $\Lambda=(\lambda_0, \lambda_1, \lambda_2, \ldots, \lambda_{N-1})$ having a size of $N=K+M_1+M_2$ using the information block S having a size K. In this case, $M_1=g$, and $M_2=N-K-g$. Furthermore, $M_1$ is the size of parity bits corresponding to the dual diagonal matrix B, and $M_2$ is the size of parity bits corresponding to the identity matrix D. The encoding process is performed, as follows:

Initialization:

$$\lambda_i = s_i \text{ for } i=0,1,\ldots,K-1$$

$$p_j = 0 \text{ for } j=0,1,\ldots,M_1+M_2-1 \quad (4)$$

First information bit $\lambda_0$ is accumulated at parity bit addresses specified in the 1st row of the sequence of the Sequence Table. For example, in an LDPC code having a length of 64800 and a code rate of 3/15, an accumulation process is as follows:

$$p_{920} = p_{920} \oplus \lambda_0$$
$$p_{963} = p_{963} \oplus \lambda_0$$
$$p_{1307} = p_{1307} \oplus \lambda_0$$
$$p_{2648} = p_{2648} \oplus \lambda_0$$
$$p_{6529} = p_{6529} \oplus \lambda_0$$
$$p_{17455} = p_{17455} \oplus \lambda_0$$
$$p_{18883} = p_{18883} \oplus \lambda_0$$
$$p_{19848} = p_{19848} \oplus \lambda_0$$
$$p_{19909} = p_{19909} \oplus \lambda_0$$
$$p_{24149} = p_{24149} \oplus \lambda_0$$
$$p_{24249} = p_{24249} \oplus \lambda_0$$
$$p_{38395} = p_{38395} \oplus \lambda_0$$
$$p_{41589} = p_{41589} \oplus \lambda_0$$
$$p_{48032} = p_{48032} \oplus \lambda_0$$
$$p_{50313} = p_{50313} \oplus \lambda_0$$

where the addition $\oplus$ occurs in GF(2).

The subsequent L−1 information bits, that is, $\lambda_m$, $m=1, 2, \ldots, L-1$, are accumulated at parity bit addresses that are calculated by the following Equation 5:

$$(x+m \times Q_1) \bmod M_1 \text{ if } x < M_1$$

$$M_1 + \{(x-M_1+m \times Q_2) \bmod M_2\} \text{ if } x \geq M_1 \quad (5)$$

where x denotes the addresses of parity bits corresponding to the first information bit $\lambda_0$, that is, the addresses of the parity bits specified in the first row of the sequence of the Sequence Table, $Q_1=M_1/L$, $Q_2=M_2/L$, and $L=360$. Furthermore, $Q_1$ and $Q_2$ are defined in the following Table 2. For example, for an LDPC code having a length of 64800 and a code rate of 3/15, $M_1=1800$, $Q_1=5$, $M_2=50040$, $Q_2=139$ and $L=360$, and the following operations are performed on the second bit $\lambda_1$ using Equation 5:

$$p_{925} = p_{925} \oplus \lambda_1$$
$$p_{968} = p_{968} \oplus \lambda_1$$
$$p_{1312} = p_{1312} \oplus \lambda_1$$
$$p_{2787} = p_{2787} \oplus \lambda_1$$
$$p_{6668} = p_{6668} \oplus \lambda_1$$
$$p_{17594} = p_{17594} \oplus \lambda_1$$
$$p_{19022} = p_{19022} \oplus \lambda_1$$
$$p_{19987} = p_{19987} \oplus \lambda_1$$
$$p_{20048} = p_{20048} \oplus \lambda_1$$
$$p_{24288} = p_{24288} \oplus \lambda_1$$
$$p_{24388} = p_{24388} \oplus \lambda_1$$
$$p_{38534} = p_{38534} \oplus \lambda_1$$
$$p_{41728} = p_{41728} \oplus \lambda_1$$
$$p_{48171} = p_{48171} \oplus \lambda_1$$
$$p_{50452} = p_{50452} \oplus \lambda_1$$

Table 2 illustrates the sizes of $M_1$, $Q_1$, $M_2$ and $Q_2$ of the designed QC-LDPC code:

TABLE 2

| | | Sizes | | | |
|---|---|---|---|---|---|
| Code rate | Length | $M_1$ | $M_2$ | $Q_1$ | $Q_2$ |
| 3/15 | 64800 | 1800 | 50040 | 5 | 139 |

The addresses of parity bit accumulators for new 360 information bits from $\lambda_L$ to $\lambda_{2L-1}$ are calculated and accumulated from Equation 5 using the second row of the sequence.

In a similar manner, for all groups composed of new L information bits, the addresses of parity bit accumulators are calculated and accumulated from Equation 5 using new rows of the sequence.

After all the information bits from $\lambda_0$ to $\lambda_{K-1}$ have been exhausted, the operations of the following Equation 6 are sequentially performed from i=1:

$$p_i = p_i \oplus p_{i-1} \text{ for } i=0,1,\ldots,M_1-1 \quad (6)$$

Thereafter, when a parity interleaving operation, such as that of the following Equation 7, is performed, parity bits corresponding to the dual diagonal matrix B are generated:

$$\lambda_{K+L \cdot t+s} = p_{Q_1 \cdot s+t} \text{ for } 0 \leq s < L, \ 0 \leq t < Q_1 \quad (7)$$

When the parity bits corresponding to the dual diagonal matrix B have been generated using K information bits $\lambda_0, \lambda_1, \ldots, \lambda_{K-1}$, parity bits corresponding to the identity matrix D are generated using the $M_1$ generated parity bits $\lambda_K, \lambda_{K+1}, \ldots, \lambda_{K+M_1-1}$.

For all groups composed of L information bits from $\lambda_K$ to $\lambda_{K+M_1-1}$, the addresses of parity bit accumulators are calculated using the new rows (starting with a row immediately subsequent to the last row used when the parity bits corresponding to the dual diagonal matrix B have been generated) of the sequence and Equation 5, and related operations are performed.

When a parity interleaving operation, such as that of the following Equation 8, is performed after all the information bits from $\lambda_K$ to $\lambda_{K+M_1-1}$ have been exhausted, parity bits corresponding to the identity matrix D are generated:

$$\lambda_{K+M_1+L\cdot t+s} = p_{M_1+Q_2\cdot s+t} \text{ for } 0 \le s < L, \, 0 \le t < Q_2 \quad (8)$$

Figure 4:
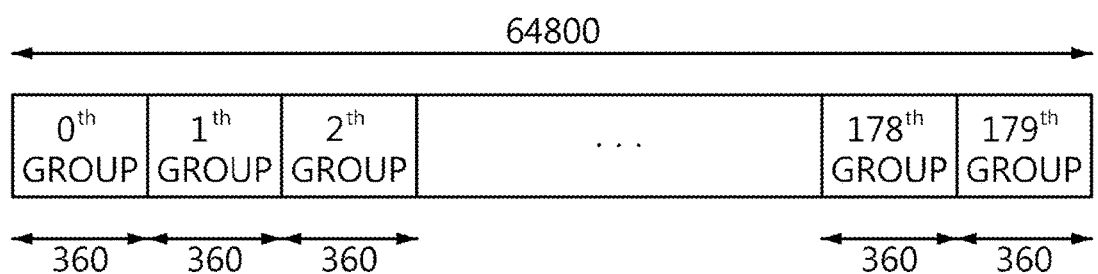
FIG. 4 is a diagram illustrating the bit groups of an LDPC codeword having a length of 64800.

FIG. 4 is a diagram illustrating the bit groups of an LDPC codeword having a length of 64800.

Referring to FIG. 4, it can be seen that an LDPC codeword having a length of 64800 is divided into 180 bit groups (a 0th group to a 179th group).

In this case, 360 may be the parallel factor (PF) of the LDPC codeword. That is, since the PF is 360, the LDPC codeword having a length of 64800 is divided into 180 bit groups, as illustrated in FIG. 4, and each of the bit groups includes 360 bits.

Figure 5:
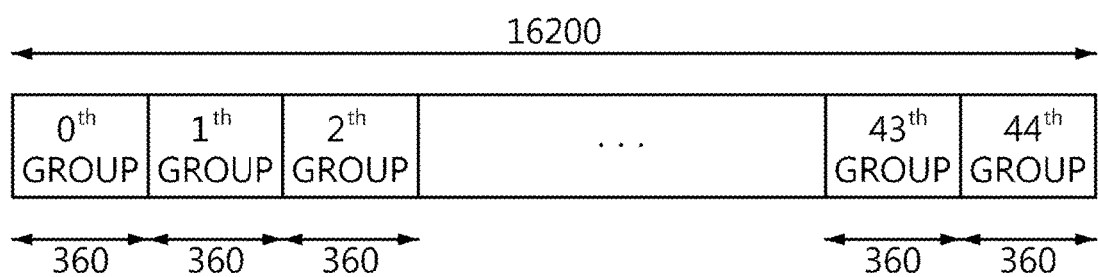
FIG. 5 is a diagram illustrating the bit groups of an LDPC codeword having a length of 16200.

FIG. 5 is a diagram illustrating the bit groups of an LDPC codeword having a length of 16200.

Referring to FIG. 5, it can be seen that an LDPC codeword having a length of 16200 is divided into 45 bit groups (a 0th group to a 44th group).

In this case, 360 may be the parallel factor (PF) of the LDPC codeword. That is, since the PF is 360, the LDPC codeword having a length of 16200 is divided into 45 bit groups, as illustrated in FIG. 5, and each of the bit groups includes 360 bits.

Figure 6:
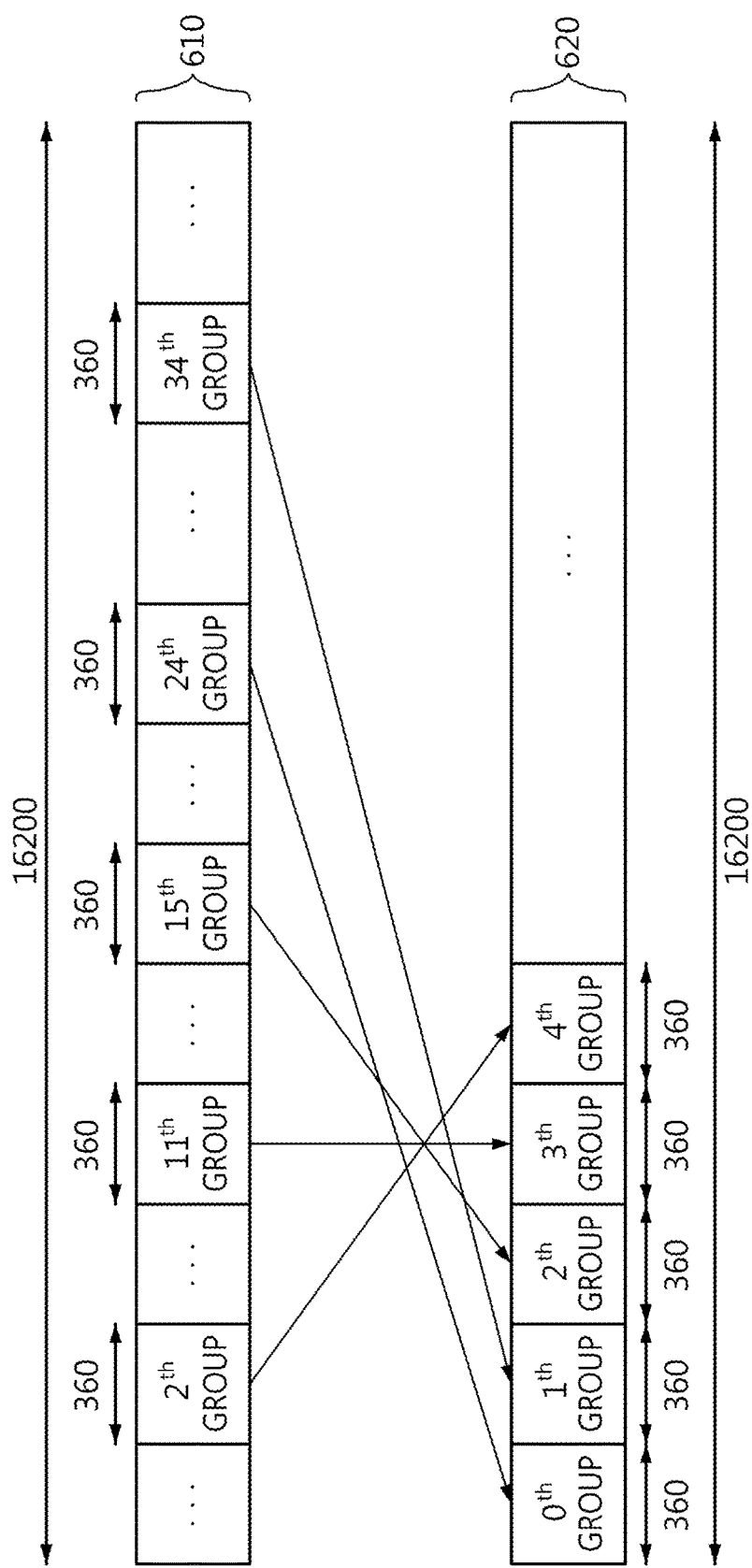
FIG. 6 is a diagram illustrating interleaving that is performed on a bit group basis in accordance with an interleaving sequence.

FIG. 6 is a diagram illustrating interleaving that is performed on a bit group basis in accordance with an interleaving sequence.

Referring to FIG. 6, it can be seen that interleaving is performed by changing the order of bit groups by a designed interleaving sequence.

For example, it is assumed that an interleaving sequence for an LDPC codeword having a length of 16200 is as follows:
ti interleaving sequence={24 34 15 11 2 28 17 25 5 38 19 13 6 39 1 14 33 37 29 12 42 31 30 32 36 40 26 35 44 4 16 8 20 43 21 7 0 18 23 3 10 41 9 27 22}

Then, the order of the bit groups of the LDPC codeword illustrated in FIG. 4 is changed into that illustrated in FIG. 6 by the interleaving sequence.

That is, it can be seen that each of the LDPC codeword 610 and the interleaved codeword 620 includes 45 bit groups, and it can be also seen that, by the interleaving sequence, the 24th bit group of the LDPC codeword 610 is changed into the 0th bit group of the interleaved LDPC codeword 620, the 34th bit group of the LDPC codeword 610 is changed into the 1st bit group of the interleaved LDPC codeword 620, the 15th bit group of the LDPC codeword 610 is changed into the 2nd bit group of the interleaved LDPC codeword 620, and the list bit group of the LDPC codeword 610 is changed into the 3rd bit group of the interleaved LDPC codeword 620, and the 2nd bit group of the LDPC codeword 610 is changed into the 4th bit group of the interleaved LDPC codeword 620.

An LDPC codeword $(u_0, u_1, \ldots, u_{N_{ldpc}-1})$ having a length of $N_{ldpc}$ is divided into $N_{group} = N_{ldpc}/360$ bit groups, as in Equation 9 below:

$$X_j = \{u_k | 360 \times j \le k < 360 \times (j+1), 0 \le k < N_{ldpc}\} \text{ for } 0 \le j < N_{group} \quad (9)$$

where $X_j$ is an j-th bit group, and each $X_j$ is composed of 360 bits.

The LDPC codeword divided into the bit groups is interleaved, as in Equation 10 below:

$$Y_j = X_{\pi(j)}, \, 0 \le j \le N_{group} \quad (10)$$

where $Y_j$ is an interleaved j-th bit group, and $\pi(j)$ is a permutation order for bit group-based interleaving (bit group-unit interleaving). The permutation order corresponds to the interleaving sequence of Equation 11 below:

interleaving sequence={74 72 104 62 122 35 130 0
95 150 139 151 133 109 31 59 18 148 9 105
57 132 102 100 115 101 7 21 141 30 8 1 93 92
163 108 52 159 24 89 117 88 178 113 98 179
144 156 54 164 12 63 39 22 25 137 13 41 44
80 87 111 145 23 85 166 83 55 154 20 84 58
26 126 170 103 11 33 172 155 116 169 142 70
161 47 3 162 77 19 28 97 124 6 168 107 60 76
143 121 42 157 65 43 173 56 171 90 131 119
94 5 68 138 149 73 67 53 61 4 86 99 75 36 15
48 177 167 174 51 176 81 120 158 123 34 49
128 10 134 147 96 160 50 146 16 38 78 91
152 46 127 27 175 135 79 125 82 2 129 153
14 40 32 114 106 17 110 140 71 136 112 45
64 29 69 118 66 37 165} (11)

That is, when each of the codeword and the interleaved codeword includes 180 bit groups ranging from a 0th bit group to a 179th bit group, the interleaving sequence of Equation 11 means that the 74th bit group of the codeword becomes the 0th bit group of the interleaved codeword, the 72th bit group of the codeword becomes the 1st bit group of the interleaved codeword, the 104th bit group of the codeword becomes the 2nd bit group of the interleaved codeword, the 62rd bit group of the codeword becomes the 3rd bit group of the interleaved codeword, . . . , the 37th bit group of the codeword becomes the 178th bit group of the interleaved codeword, and the 165th bit group of the codeword becomes the 179th bit group of the interleaved codeword.

In particular, the interleaving sequence of Equation 11 has been optimized for a case where 64-symbol mapping (NUC symbol mapping) is employed and an LDPC coder having a length of 64800 and a code rate of 3/15 is used.

Figure 7:
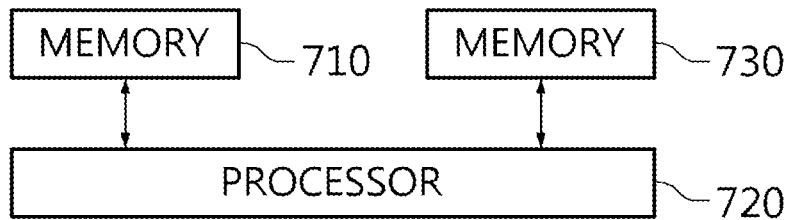
FIG. 7 is a block diagram illustrating a bit interleaver according to an embodiment of the present invention.

FIG. 7 is a block diagram illustrating a bit interleaver according to an embodiment of the present invention.

Referring to FIG. 7, the bit interleaver according to the present embodiment includes memories 710 and 730 and a processor 720.

The memory 710 stores an LDPC codeword having a length of 64800 and a code rate of 3/15.

The processor 720 generates an interleaved codeword by interleaving the LDPC codeword on a bit group basis corresponding to the parallel factor of the LDPC codeword.

In this case, the parallel factor may be 360. In this case, each of the bit groups may include 360 bits.

In this case, the LDPC codeword may be divided into 180 bit groups, as in Equation 9.

In this case, the interleaving may be performed using Equation 10 using permutation order.

In this case, the permutation order may correspond to the interleaving sequence represented by Equation 11.

The memory 730 provides the interleaved codeword to a modulator for 64-symbol mapping.

In this case, the modulator may be a symbol mapping device performing NUC (Non-Uniform Constellation) symbol mapping.

The memories 710 and 730 may correspond to various types of hardware for storing a set of bits, and may correspond to a data structure, such as an array, a list, a stack, a queue or the like.

In this case, the memories 710 and 730 may not be physically separate devices, but may correspond to different addresses of a physically single device. That is, the memories 710 and 730 are not physically distinguished from each other, but are merely logically distinguished from each other.

The error-correction coder 13 illustrated in FIG. 1 may be implemented in the same structure as in FIG. 7.

That is, the error-correction coder may include memories and a processor. In this case, the first memory is a memory that stores an LDPC codeword having a length of 64800 and a code rate of 3/15, and a second memory is a memory that is initialized to 0.

The memories may correspond to $\lambda_i$ (i=0, 1, ..., N−1) and $P_j$ (j=0, 1, ..., $M_1+M_2-1$), respectively.

The processor may generate an LDPC codeword corresponding to information bits by performing accumulation with respect to the memory using a sequence corresponding to a parity check matrix (PCM).

In this case, the accumulation may be performed at parity bit addresses that are updated using the sequence of the above Sequence Table.

In this case, the LDPC codeword may include a systematic part $\lambda_0, \lambda_1, \ldots, \lambda_{K-1}$ corresponding to the information bits and having a length of 12960 (=K), a first parity part $\lambda_K, \lambda_{K+1}, \ldots, \lambda_{K+M_1-1}$ corresponding to a dual diagonal matrix included in the PCM and having a length of 1800 (=$M_1$=g), and a second parity part $\lambda_{K-M_1}, \lambda_{K+M_1+1}, \ldots, \lambda_{K+M_1+M_2-1}$ corresponding to an identity matrix included in the PCM and having a length of 50040 (=$M_2$).

In this case, the sequence may have a number of rows equal to the sum (12960/360+1800/360=41) of a value obtained by dividing the length of the systematic part, i.e., 12960, by a CPM size L corresponding to the PCM, i.e., 360, and a value obtained by dividing the length $M_1$ of the first parity part, i.e., 1800, by 360.

As described above, the sequence may be represented by the above Sequence Table.

In this case, the second memory may have a size corresponding to the sum $M_1+M_2$ of the length $M_1$ of the first parity part and the length $M_2$ of the second parity part.

In this case, the parity bit addresses may be updated based on the results of comparing each x of the previous parity bit addresses, specified in respective rows of the sequence, with the length $M_1$ of the first parity part.

That is, the parity bit addresses may be updated using Equation 5. In this case, x may be the previous parity bit addresses, m may be an information bit index that is an integer larger than 0 and smaller than L, L may be the CPM size of the PCM, $Q_1$ may be $M_1/L$, $M_1$ may be the size of the first parity part, $Q_2$ may be $M_2/L$, and $M_2$ may be the size of the second parity part.

In this case, it may be possible to perform the accumulation while repeatedly changing the rows of the sequence by the CPM size L (=360) of the PCM, as described above.

In this case, the first parity part $\lambda_K, \lambda_{K+1}, \ldots, \lambda_{K+M_1+M_2-1}$ may be generated by performing parity interleaving using the first memory and the second memory, as described in conjunction with Equation 7.

In this case, the second parity part $\lambda_{K+M_1}, \lambda_{K+M_1+1}, \ldots, \lambda_{K+M_1+M_2-1}$ may be generated by performing parity interleaving using the first memory and the second memory after generating the first parity part $\lambda_K, \lambda_{K-1}, \ldots, \lambda_{K+M_1-1}$ and then performing the accumulation using the first parity part $\lambda_K, \lambda_{K+1}, \ldots, \lambda_{K+M_1-1}$ and the sequence, as described in conjunction with Equation 8.

Figure 8:
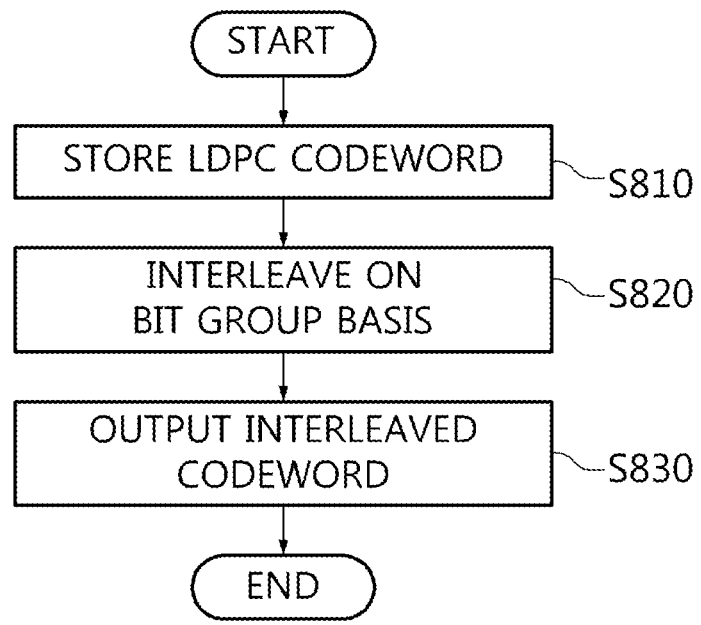
FIG. 8 is an operation flowchart illustrating a bit interleaving method according to an embodiment of the present invention.

FIG. 8 is an operation flowchart illustrating a bit interleaving method according to an embodiment of the present invention.

Referring to FIG. 8, in the bit interleaving method according to the present embodiment, an LDPC codeword having a length of 64800 and a code rate of 3/15 is stored at step S810.

In this case, the LDPC codeword may be represented by ($u_0, u_1, \ldots, u_{N_{ldpc}-1}$) (where $N_{ldpc}$ is 64800), and may be divided into 180 bit groups each composed of 360 bits, as in Equation 9.

Furthermore, in the bit interleaving method according to the present embodiment, an interleaved codeword is generated by interleaving the LDPC codeword on a bit group basis at step S820.

In this case, the size of the bit group may correspond to the parallel factor of the LDPC codeword.

In this case, the interleaving may be performed using Equation 10 using permutation order.

In this case, the permutation order may correspond to the interleaving sequence represented by Equation 11.

In this case, the parallel factor may be 360, and each of the bit groups may include 360 bits.

In this case, the LDPC codeword may be divided into 180 bit groups, as in Equation 9.

Moreover, in the bit interleaving method according to the present embodiment, the interleaved codeword is output to a modulator for 64-symbol mapping at step 830.

In accordance with at least one embodiment of the present invention, there is provided an intra-BICM bit interleaver that can effectively distribute burst errors occurring in a broadcasting system channel.

In accordance with at least one embodiment of the present invention, there is provided a bit interleaver that is optimized for an LDPC coder having a length of 64800 and a code rate of 3/15 and a modulator performing 64-symbol mapping and, thus, can be applied to next-generation broadcasting systems, such as ATSC 3.0.

Although the specific embodiments of the present invention have been disclosed for illustrative purposes, those skilled in the art will appreciate that various modifications, additions and substitutions are possible without departing from the scope and spirit of the invention as disclosed in the accompanying claims.

What is claimed is:

1. A bit-interleaved coded modulation (BICM) device, comprising:
   an error-correction coder configured to output a low-density parity check (LDPC) codeword having a length of 64800 and a code rate of 3/15;
   an interleaver configured to generate an interleaved codeword by interleaving the LDPC codeword on a bit group basis, the size of a bit group corresponding to a parallel factor of the LDPC codeword; and
   a modulator configured to perform 64-symbol mapping after generating the interleaved codeword,
   wherein the interleaved codeword is generated by using the following equation using permutation order:

$Y_j = X_{\pi(j)} 0 \leq j > N_{group}$ where $X_{\pi(j)}$ is a $\pi(j)$th bit group, $Y_j$ is an interleaved j-th bit group, $N_{group}$ is the number of bit groups obtained by dividing the LDPC codeword into the bit groups, and $\pi(j)$ is a permutation order for bit group-based interleaving, and
   wherein the permutation order corresponds to an interleaving sequence represented by the following interleaving sequence:

{74 72 104 62 122 35 130 0 95 150 139 151 133
   109 31 59 18 148 9 105 57 132 102 100 115
   101 7 21 141 30 8 1 93 92 163 108 52 159 24
   89 117 88 178 113 98 179 144 156 54 164 12
   63 39 22 25 137 13 41 44 80 87 111 145 23 85
   166 83 55 154 20 84 58 26 126 170 103 11 33
   172 155 116 169 142 70 161 47 3 162 77 19

28 97 124 6 168 107 60 76 143 121 42 157 65
43 173 56 171 90 131 119 94 5 68 138 149 73
67 53 61 4 86 99 75 36 15 48 177 167 174 51
176 81 120 158 123 34 49 128 10 134 147 96
160 50 146 16 38 78 91 152 46 127 27 175
135 79 125 82 2 129 153 14 40 32 114 106 17
110 140 71 136 112 45 64 29 69 118 66 37
165}.

2. The BICM device of claim 1, wherein the 64-symbol mapping is a Non-Uniform Constellation (NUC) symbol mapping which corresponds to 64 constellations.

3. The BICM device of claim 2, wherein the parallel factor is 360, and the bit group includes 360 bits.

4. The BICM device of claim 3, wherein the LDPC codeword is represented by $(u_0, u_1, \ldots, u_{N_{ldpc}-1})$ (where $N_{ldpc}$ is 64800), and is divided into 180 bit groups each including 360 bits, as in the following equation:

$$X_j = \{u_k | 360 \times j \leq k < 360 \times (j+1), 0 \leq k < N_{ldpc}\} \text{ for } 0 \leq j < N_{group}$$

where $X_j$ is an j-th bit group, $N_{ldpc}$ is 64800, and $N_{group}$ is 180.

* * * * *